(12) United States Patent
Beamish et al.

(10) Patent No.: US 8,532,583 B2
(45) Date of Patent: Sep. 10, 2013

(54) SEMICONDUCTOR DEVICE, WIRELESS COMMUNICATION DEVICE AND METHOD FOR GENERATING A SYNTHESIZED FREQUENCY SIGNAL

(75) Inventors: Norman Beamish, Cork (IE); Niall Kearney, Killeagh (IE)

(73) Assignee: Freescale Semiconductor, Inc., Austin, TX (US)

( * ) Notice: Subject to any disclaimer, the term of this patent is extended or adjusted under 35 U.S.C. 154(b) by 261 days.

(21) Appl. No.: 13/003,951

(22) PCT Filed: Jul. 17, 2008

(86) PCT No.: PCT/IB2008/052871
§ 371 (c)(1),
(2), (4) Date: Jan. 13, 2011

(87) PCT Pub. No.: WO2010/007471
PCT Pub. Date: Jan. 21, 2010

(65) Prior Publication Data
US 2011/0121872 A1 May 26, 2011

(51) Int. Cl.
*H04B 1/40* (2006.01)
(52) U.S. Cl.
USPC ............. 455/76; 455/78; 455/265; 455/260; 455/86; 455/180.3; 327/158; 327/276; 327/161; 331/34
(58) Field of Classification Search
USPC ............. 455/76, 78, 265, 73, 260, 86, 180.3
See application file for complete search history.

(56) References Cited

U.S. PATENT DOCUMENTS

| | | | |
|---|---|---|---|
| 3,993,957 A | 11/1976 | Davenport | |
| 4,241,418 A * | 12/1980 | Stanley | 713/501 |
| 4,420,696 A * | 12/1983 | Gemma et al. | 327/239 |
| 4,560,960 A * | 12/1985 | Chanrion | 331/178 |
| 4,684,897 A * | 8/1987 | Richards et al. | 327/113 |
| 5,055,800 A * | 10/1991 | Black et al. | 331/1 A |
| 5,055,802 A * | 10/1991 | Hietala et al. | 331/16 |
| 6,150,886 A * | 11/2000 | Shimomura | 331/2 |
| 6,211,747 B1 * | 4/2001 | Trichet et al. | 332/128 |
| 6,259,293 B1 * | 7/2001 | Hayase et al. | 327/276 |
| 6,564,039 B1 * | 5/2003 | Meador et al. | 455/76 |
| 7,145,967 B2 * | 12/2006 | Chen | 375/334 |
| 7,649,968 B2 * | 1/2010 | Barber et al. | 375/354 |
| 7,684,763 B2 * | 3/2010 | Boos | 455/73 |

OTHER PUBLICATIONS

Spataro Anne et al: "A VLSI CMOS Delay Oriented Waveform Converter for Polyphase Frequency Synthesizer" IEEE Journal of Solid-State Circuits, vol. 37, No. 3, Mar. 2002, pp. 336-341.
Rahkonen Timo et al: "A DDS Synthesizer with Time Domain Interpolator" IEEE International Conference on Electronics, Circuits and Systems, 1999 (vol. 1, Issue, 1999) pp. 327-330.
International Search Report and Written Opinion correlating to PCT/IB2008/052871 dated Jul. 17, 2009.

* cited by examiner

*Primary Examiner* — Marceau Milord

(57) ABSTRACT

A semiconductor device comprises synthesized frequency generation logic arranged to receive a reference signal, and to generate a synthesized frequency signal from the reference signal. The synthesized frequency generation logic comprises programmable divider logic arranged to receive the reference signal and to generate a divided signal comprising a frequency with a period substantially equal to N times that of the reference signal, where N comprises a programmable integer value. The synthesizer frequency generation logic is arranged to generate the synthesized frequency signal comprising a frequency with a period substantially equal to 1/M that of the divided signal, where M comprises a further programmable integer value.

20 Claims, 10 Drawing Sheets

SEMICONDUCTOR DEVICE, WIRELESS COMMUNICATION DEVICE AND METHOD FOR GENERATING A SYNTHESIZED FREQUENCY SIGNAL

FIELD OF THE INVENTION

The field of this invention relates to a semiconductor device, and more particularly to a semiconductor device comprising synthesized frequency generation logic, and a method for generating a synthesized frequency signal.

BACKGROUND OF THE INVENTION

As radio frequency (RF) communication systems evolve, the range of frequency bands that transceivers within mobile communication devices are required to support continues to grow. Currently, a typical transceiver adapted to support communication within, for example, a Universal Mobile Telecommunications System (UMTS) may be required to support up to eleven distinct frequency bands.

Traditional frequency generation solutions utilise a Phase Locked Loop (PLL), which contains a Voltage Controlled Oscillator (VCO) that can be tuned over a range of frequencies. However, the cost of supporting a wide tuning range includes increased current consumption, a requirement for a higher quality of inductors that consume either significant amounts of silicon area or module board area, and increased design challenge to meet noise requirements simultaneously over all the supported frequency bands. Accordingly, in order to support the wide range of frequency bands required for UMTS transceivers and the like, conventional solutions require the use of two or more VCOs to provide two or more reference signals from which to generate required synthesized signals.

As will be appreciated, as process geometries shrink, the size of transistors within semiconductor devices is comparably becoming smaller. Conversely, the rate at which analogue components, such as capacitors and inductors, are becoming smaller is significantly less than the rate at which transistors are becoming smaller. The continual drive for reducing the size of integrated circuits and semiconductor devices has lead to a need to develop systems and devices that take advantage of the greater rate of reduction in the size of transistors, and thus digital components, whilst minimising the effect of the relatively slow rate at which analogue components are becoming smaller.

As will also be appreciated, VCOs comprise analogue components, which have become relatively bulky in terms of integrated circuits and semiconductor devices. Furthermore, VCOs require relatively large inductors, thereby further increasing the silicon area taken up by the presence of VCOs. Thus, VCOs are relatively expensive in terms of silicon area of a semiconductor device, and therefore have a direct effect on the cost of producing the semiconductor devices, since the greater the silicon area of a device, the fewer devices that can be manufactured from a single wafer.

FIG. 1 illustrates an example of a known Delay Locked Loop (DLL) Synthesizer 100, used to generate a plurality of synthesized frequency signals from a single VCO. The synthesizer 100 comprises a Phase-Locked Loop (PLL) 110, operably coupled to a local oscillator 120, for example a Voltage Controlled Oscillator (VCO). The PLL 110 is arranged to provide a control signal to the local oscillator 120, and as such to cause the local oscillator 120 to generate a fixed reference frequency signal $f_{ref}$ 125. The synthesizer 100 further comprises M delay elements 130, operably coupled to delay control logic 140. The first delay element 132 receives the fixed reference frequency signal $f_{ref}$ and introduces a delay to the reference signal $f_{ref}$ 125. An identical delay is subsequently introduced by each of the M delay elements 130. The length of the delay introduced by each delay element 130 may be defined as T/M, where T is the period of the fixed frequency signal $f_{ref}$ 125 generated by the local oscillator 120 and M is the number of delay elements. In this manner, the delay elements 130 output M component signals 150 with their corresponding edge transitions separated in time by T/M.

Thus, from a reference square wave signal in a form of the fixed reference frequency signal $f_{ref}$ generated by the local oscillator 120, the delay elements 130 generate M square waves, in the form of component signals 150, comprising transition edges offset in time relative to one another by a period of T/M. These component signals 150 are then provided to digital processing logic 160, which selects which of the component signals 150 to output at any one time, in order to generate the required synthesized frequency signal 170. Only one component signal 150 is ever connected to the output at one time. In this manner, the output synthesized frequency signal 170 is constructed from the components signals 150.

FIG. 2 illustrates an example of a synthesized frequency signal 170 generated by the digital processing logic 160 of FIG. 1. As previously mentioned, the digital processing logic 160 receives the M component signals 150, and selects those component signals 150 to output at any one time, in order to generate the synthesized frequency signal $f_{out}$ 170. For the example illustrated in FIG. 2, M=6, and as such there are six component signals 210, 220, 230, 240, 250, 260 comprising edge transitions separated in time by T/6, where T is the period of a cycle 205 of the fixed frequency signal $f_{ref}$ 125. The digital processing logic 160 is arranged to generate a synthesized frequency signal 170 comprising a period of 2T/3. Accordingly, the digital processing logic 160 selects component signals to output that will provide edge transitions corresponding to a synthesized signal comprising a period of 2T/3. Thus, for the example illustrated in FIG. 2, the digital processing logic 160 is initially configured to output the component signal 210 comprising the fixed frequency signal $f_{ref}$ 125 delayed by T/6. In this manner, the synthesized frequency signal 170 comprises a falling edge transition 272 corresponding to a falling edge transition 212 of the selected component signal 210. The digital processing logic 160 then selects the component signal 260 comprising the fixed frequency signal $f_{ref}$ 125 delayed by T. In this manner, the synthesized frequency signal 170 comprises a subsequent rising edge transition 274 corresponding to the rising edge transition 264 of the selected component signal 260. The digital processing logic 160 then selects the component signal 250 comprising the fixed frequency signal $f_{ref}$ 125 delayed by 5T/6. In this manner, the synthesized frequency signal 170 comprises a subsequent falling edge transition 276 corresponding to the falling edge transition 256 of the selected component signal 250. As can be seen in FIG. 2, in this manner the digital processing logic 160 is able to select those component signals to output that provide edge transitions substantially T/3 apart, thus generating a synthesized frequency signal 170 comprising a period of 2T/3.

As will be appreciated, the use of such delay elements to progressively delay the fixed frequency signal $f_{ref}$ in this manner results in the quantisation in time of the fixed frequency signal $f_{ref}$. Thus, in this manner, the synthesizer 100 is able to generate multiple synthesized frequency signals using only a single VCO 120.

However, a problem with known DLL synthesizers, such as synthesizer 100 of FIG. 1, is that the quantisation in time of the fixed frequency signal $f_{ref}$ results in a creation of quantisation noise at synthesized frequencies requiring edge transitions that do not correspond precisely with those of the component signals. That is to say, if a required synthesized frequency signal comprises a period that is not a precise integer multiple of 2T/M, the edges of the required synthesized frequency signal will not coincide with edges of the component signals 150, and quantisation errors in time will occur. For example, if a desired synthesized frequency signal requires an edge that falls between the edges of adjacent component signals 150, for example as indicated at point 280 in FIG. 2, an instantaneous error due to quantisation of the time axis at this point will occur within the output synthesized frequency signal, resulting in frequency spurs within the output synthesized frequency signal.

According to "A DDS synthesizer with time domain interpolator", Rahkonen, T; Eksyma, H; Proceedings of ICECS apox; 99, The $6^{th}$ IEEE International Conference on Electronics, Circuits and Systems 1999 (Volume 1, Issue, 1999 Pages 327-330), peak spur energy in dBc is typically bounded according to the relationship: $-20 \log((M-1)*f_{ref}/f_{out})$. Furthermore, it is known that spur locations change with output frequency. For transceivers that do not use surface acoustic wave (SAW) technology, spurs need to be at or below the noise frequency to avoid reciprocal mixing. Accordingly, to achieve, say, a peak spur energy level of $-168$ dBc/Hz, 16,384 delay elements are required, which for a reference frequency signal $f_{ref}$ of 1 GHz equates to each delay element comprising a delay increment of 61 fsec. As will be appreciated by a skilled artisan, this is an impractically small delay increment.

Accordingly, in order for a transceiver comprising such a synthesizer to be able to support up to eleven frequency bands within, for example, a Universal Mobile Telecommunications System (UMTS), without instantaneous errors occurring, it is still necessary for the synthesizer to utilise two or more VCOs.

Furthermore, in a full duplex system a transceiver is required to support simultaneous transmit and receive operations. FIG. 9 illustrates an example of a traditional transceiver architecture 900 where the transmitter and receiver frequency references 910, 920 are separately and independently generated. As will be appreciated, for such a traditional transceiver architecture 900, the VCOs and associated analogue components that are required to support, for example, the eleven frequency channels are each required to be duplicated, one for each of the transmit and receive frequency references 910, 920. Thus, the abovementioned problems are typically also duplicated in full duplex systems.

The Long Term Evolution (LTE) project for the third generation (3G) of mobile telecommunications currently being developed by the 3rd Generation Partnership Project (www.3gpp.com), which although not a committed standard, is expected to be for the most part implemented in the future, anticipates extending the number of frequency bands that are required to be supported within a UMTS network from eleven to fourteen. As a result, known frequency synthesizers require additional VCOs in order to support the extra frequency bands, thus further increasing the relative cost in terms of both silicon area and price of semiconductor devices therefor.

SUMMARY OF THE INVENTION

The present invention provides a semiconductor device, a wireless communication device and a method for generating a synthesized frequency signal, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS OF THE INVENTION

Figure 3:
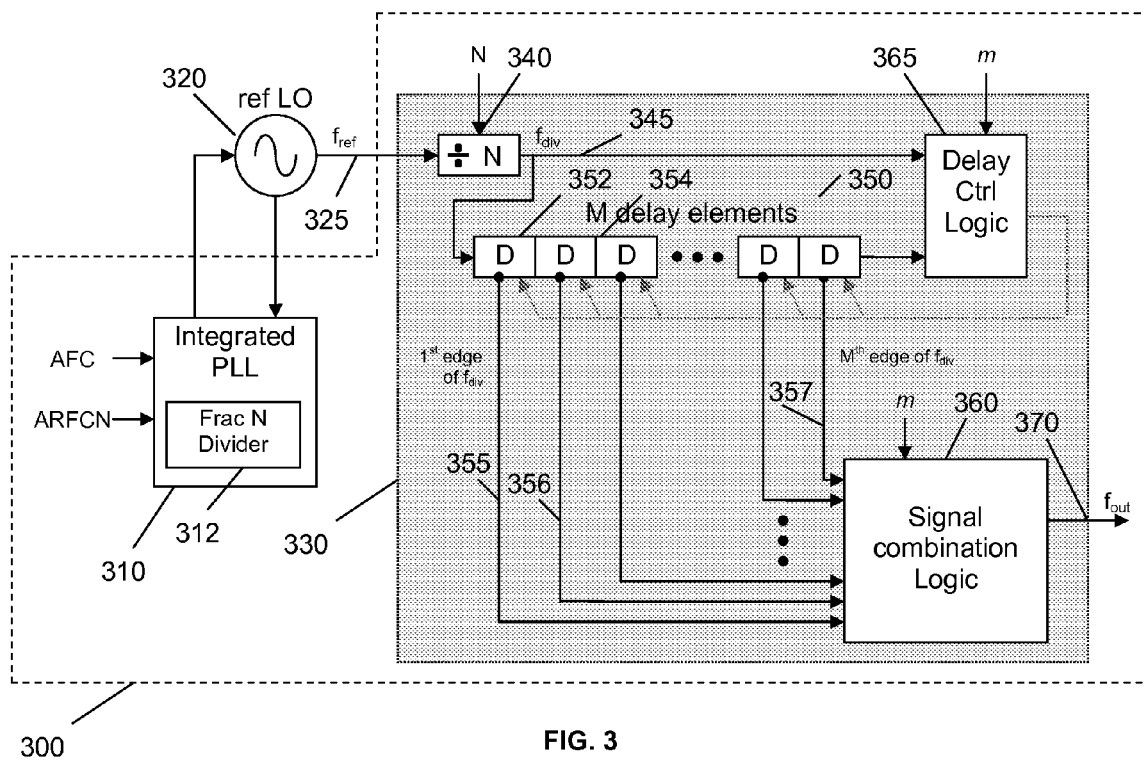
FIG. 3 illustrates a part of a semiconductor device comprising a hybrid DLL synthesizer according to some embodiments of the invention.

Referring now to FIG. 3, there is illustrated an example of part of a semiconductor device 300 adapted according to some embodiments of the invention. The semiconductor device 300 comprises synthesized frequency generation logic 330 arranged to receive a reference signal ($f_{ref}$) 325, and to generate a synthesized frequency signal ($f_{out}$) 370 from the reference signal ($f_{ref}$) 325. For the illustrated embodiment, the reference signal ($f_{ref}$) 325 is generated by way of a local oscillator 320, for example in the form of a Voltage Controlled Oscillator (VCO). The synthesized frequency generation logic 330 comprises a programmable divider logic 340 arranged to receive the reference signal 325 and to generate a divided signal ($f_{div}$) 345 comprising a frequency with a period substantially equal to N times that of the reference signal 325, where N comprises a programmable integer value. The synthesized frequency generation logic 330 is then arranged to generate the synthesized frequency signal 370 comprising a frequency with a period substantially equal to 1/M that of the divided signal ($f_{div}$) 345, where M may also comprise a programmable integer value.

In this manner, the programmable divider logic 340 enables the synthesized frequency generation logic 330 to generate synthesized frequency signals that are not limited to necessarily having edges that coincide with edges of the reference signal ($f_{ref}$) 325 that is generated by the local oscillator 320. Thus, the synthesized frequency generation logic 330 is not limited to generating synthesized frequency signals comprising frequencies equal to integer multiples (1/M) of the reference signal ($f_{ref}$) 325. Instead, the synthesized frequency generation logic 330 adapted according to embodiments of the invention is able to generate synthesized frequency signals ($f_{out}$) 370 comprising frequencies that have periods that are substantially equal to N/M that of the frequency of the reference signal 325. As previously mentioned, both N and M are programmable integers. Thus, from a single reference signal, the synthesized frequency generation logic 330 is able to be programmed to generate synthesized frequency signals ($f_{out}$) 370 comprising a greater range of frequencies than the prior art frequency synthesizer of FIG. 1. Significantly, the synthesized frequency generation logic 330 disclosed herein does not introduce a significant amount of quantisation noise because the synthesized frequency generation logic 330 is locked to one cycle of the divided reference signal 345.

For the semiconductor device 300 illustrated in FIG. 3, the semiconductor device 300 further comprises programmable oscillator control logic 310, operably coupled to the local oscillator 320. The programmable oscillator control logic 310 is arranged to programmably control the frequency of the reference signal ($f_{ref}$) 325 that is generated by local oscillator 320. As will be appreciated, slight variations in the frequency of the reference signal ($f_{ref}$) 325 will have an effect on the synthesized frequency signal ($f_{out}$) 370 generated by the synthesized frequency generation logic 330. Thus, the programmable oscillator control logic 310 provides the ability to further vary the range of frequencies that the synthesized frequency generation logic 330 is able to generate.

For the illustrated embodiment, the programmable oscillator control logic 310 comprises a Phased-Locked Loop (PLL), programmable by way of a tuning control in the form of an Absolute Radio Frequency Channel Number (ARFCN) input signal. As will be appreciated, cellular communication networks communicate with wireless communication units over a range of carrier frequencies. For example, for a GSM (Global System for Mobile Communications) network, carrier frequencies are designated by an Absolute Radio Frequency Channel Number (ARFCN). Similarly, for a UMTS network, carrier frequencies are specified by a UTRA (Universal Terrestrial Radio Access) Absolute Radio Frequency Channel Number (UARFCN). For simplicity, the term Absolute Radio Frequency Channel Number, and its acronym ARFCN, will hereinafter encompass UTRA Absolute Radio Frequency Channel Numbers (UARFCNs). In this manner, the programmable oscillator control logic 310 may be provided with an ARFCN for which a synthesized frequency signal is required to be generated, and using the ARFCN input signal, configure the local oscillator to generate an appropriate reference signal. For example, the PLL 310 may be programmed by controlling a divide ratio used by a fractional 'N' divider 312 within the PLL 310, whereby there is a direct relationship between each ARFCN and the necessary divide ratio.

In one embodiment of the invention, the programmable oscillator control logic 310 further comprises an Automatic Frequency Control (AFC) input signal. As will be appreciated, AFC is a mechanism for automatically maintaining a tuning of a signal to a desired frequency. For example, a circuit (not shown) develops an error voltage proportional to the degree to which, say, the oscillator 320 is mistuned. This error voltage may then be fed back to the programmable oscillator control logic 310 in the form of the AFC input signal, thereby enabling the oscillator control logic 310 to correct any error in the reference signal generated by the oscillator 320.

The synthesized frequency generation logic 330 of the illustrated embodiment is in a form of a Delay Locked Loop (DLL) comprising delay elements 350, operably coupled to the divider logic 340. A first delay element 352 is arranged to receive the divided signal ($f_{div}$) 345 generated by the divider logic 340, and to introduce a delay to the divided signal ($f_{div}$) 345 to generate a first component signal 355 comprising a delayed edge transition of the divided signal ($f_{div}$) 345 generated by the divider logic 340. A substantially equal delay is subsequently introduced by each of the remaining delay elements 350, such that each of the delay elements 350 generates a component signal 355, 356, 357 comprising a correspondingly delayed edge transition of the divided signal ($f_{div}$) 345 generated by the divider logic 340. The length of the delay introduced by each delay element 350 may be defined as T/M, where T is the period of the divided signal ($f_{div}$) 345 generated by the divider logic 340, and M is the programmable number of component signals 355, 356, 357 generated by the delay elements 350. In this manner, the delay elements 350 are arranged to generate at least M component signals 355, 356, 357 comprising corresponding edge transitions separated in time by T/M, Accordingly, the first delay element 352 generates a first component signal 355 comprising the divided signal ($f_{div}$) 345 delayed by a period of T/M, a second delay element 354 generates a second component signal 356 comprising the first component signal 355 delayed by a period of T/M, and so on through to an $M^{th}$ delay element 350 generating an $M^{th}$ component signal 357 comprising the $(M-1)^{th}$ component signal delayed by a period of T/M. The component signals 355, 356, 357 are provided to digital processing logic, which for the illustrated embodiment comprises a form of signal combination logic 360, which generates the synthesized frequency signal $f_{out}$ 370 based at least partly on a combination of the component signals 355, 356, 357 provided thereto by selecting those component signals 355, 356, 357 to output at any one time.

Figure 4:
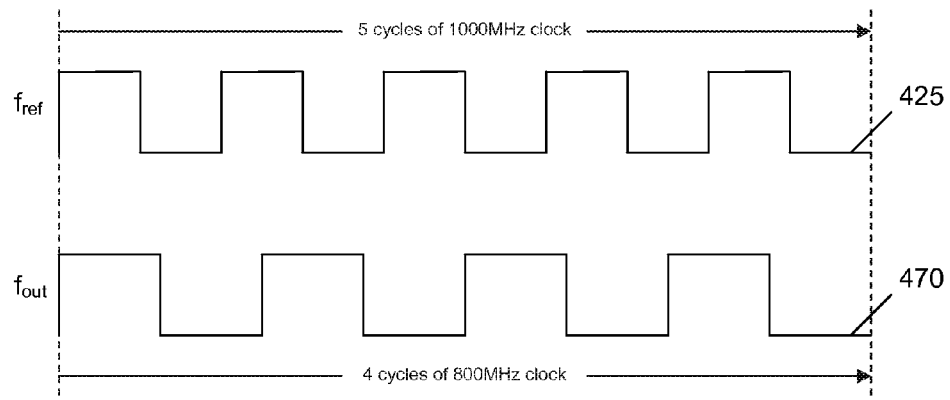
FIG. 4 illustrates an example of a reference signal and a synthesized frequency signal in accordance with some embodiments of the invention.

Referring now to FIG. 4, there is illustrated an example of a reference signal ($f_{ref}$) 425 and a synthesized frequency signal ($f_{out}$) 470, for example as generated by the synthesized frequency generation logic 330 of FIG. 3 based on the reference signal ($f_{ref}$) 425. For the example illustrated in FIG. 4, the reference signal ($f_{ref}$) 425 comprises a frequency of 1000 MHz. Furthermore, the divider logic 340 of the synthesized frequency generation logic 330 is programmed such that the integer value N equals '5'. Accordingly, the divider logic 340 is arranged to generate a divided signal comprising a frequency substantially equal to one fifth that of the reference signal. Thus, the divider logic 340 generates a divided signal comprising a frequency of 250 MHz. In addition, the number of component signals required within the synthesized frequency generation logic is selected as M, where M equals '4'. Accordingly, the synthesized frequency generation logic 330 is arranged to generate the synthesized frequency signal 470 comprising a frequency with a period substantially equal to one quarter that of the period of the divided signal. Thus, according to embodiments of the invention, the synthesized frequency generation logic 330 generates a synthesized frequency signal 470 comprising a frequency of 800 MHz.

Figure 5:
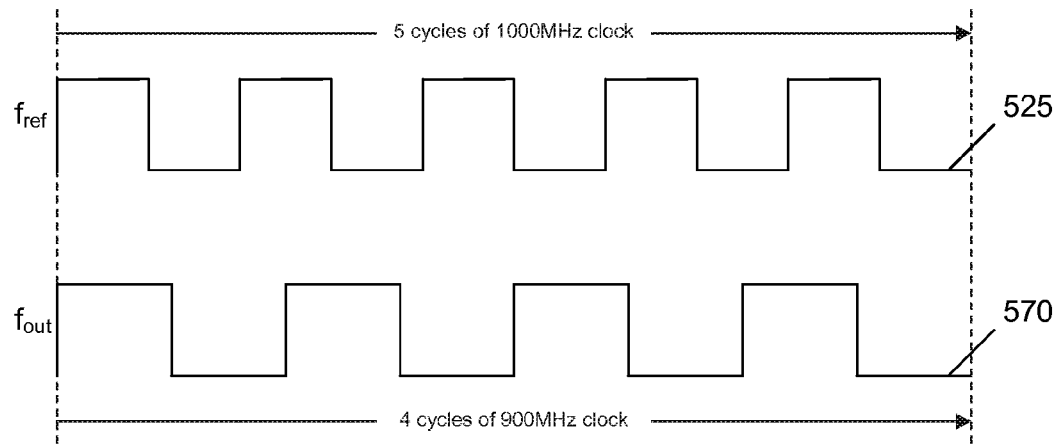
FIG. 5 illustrates a further example of a reference signal and a synthesized frequency signal in accordance with some embodiments of the invention.

Referring now to FIG. 5, there is illustrated a further example of a reference signal ($f_{ref}$) 525 and a synthesized frequency signal ($f_{out}$) 570, for example as generated by the synthesized frequency generation logic 330 of FIG. 3 based on the reference signal ($f_{ref}$) 525. In the same way as for the example illustrated in FIG. 4, the reference signal ($f_{ref}$) 525 comprises a frequency of 1000 MHz. However, for the example illustrated in FIG. 5, the divider logic 340 of the synthesized frequency generation logic 330 is programmed such that the integer value N equals '10'. Accordingly, the divider logic 340 is arranged to generate a divided signal comprising a frequency substantially equal to one tenth that of the reference signal. Thus, the divider logic 340 generates a divided signal comprising a frequency of 90 MHz. In addition, the synthesized frequency generation logic 330 is programmed such that the integer value M equals '9'. Accordingly, the synthesized frequency generation logic 330 is arranged to generate the synthesized frequency signal 470 comprising a frequency substantially equal to 9 times that of the divided signal. Thus, according to embodiments of the invention, the synthesized frequency generation logic 330 generates a synthesized frequency signal 470 comprising a frequency of 900 MHz.

Figure 6:
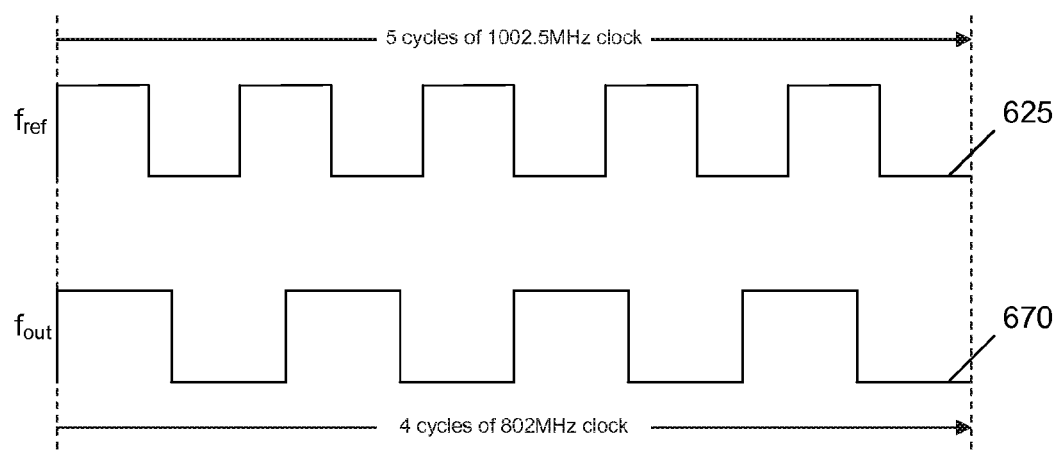
FIG. 6 illustrates a yet further example of a reference signal and a synthesized frequency signal in accordance with some embodiments of the invention.

As previously mentioned, in accordance with some embodiments of the invention, the local oscillator 320 arranged to generate the reference signal may be programmably controlled by the programmable oscillator control logic 310 in order to vary the frequency of the reference signal. FIG. 6 illustrates an example of a reference signal ($f_{ref}$) 625 comprising a frequency that has been slightly varied compared to that of FIGS. 4 and 5, and a synthesized frequency signal ($f_{out}$) 670, for example as generated by the synthesized frequency generation logic 330 of FIG. 3 based on the reference signal ($f_{ref}$) 625. For the example illustrated in FIG. 6, the reference signal ($f_{ref}$) 625 comprises a frequency of 1002.5 MHz, a variation of 2.5 MHz (or 0.25%) in comparison to that of FIGS. 4 and 5. In the same manner as for FIG. 4, the divider logic 340 of the synthesized frequency generation logic 330 is programmed such that the integer value N equals '5'. Accordingly, the divider logic 340 is arranged to generate a divided signal comprising a frequency substantially equal to one fifth that of the reference signal. Thus, the divider logic 340 generates a divided signal comprising a frequency of 200.5 MHz. In addition, the synthesized frequency generation logic 330 is programmed such that the integer value M equals '4'. Accordingly, the synthesized frequency generation logic 330 is arranged to generate the synthesized frequency signal 670 comprising a frequency substantially equal to 4 times that of the divided signal. Thus, the synthesized frequency generation logic 330 generates a synthesized frequency signal 670 comprising a frequency of 802 MHz.

As illustrated in FIGS. 4 to 6, and as described above, the synthesized frequency generation logic 330, and in accordance with some embodiments the oscillator control logic 310, may be configured to generate a range of synthesized frequency signals by programming the variables 'N' and 'M', and in some embodiments of the invention the tuning control of the reference VCO, which for the illustrated embodiment is in a form of the ARFCN input signal. For example a tuning control word may be used to programme the values for the variables 'N' and 'M', and the tuning control of the reference VCO in the case of a digital or part-digital PLL. In this manner, a tuning control word corresponding to a required synthesized frequency signal $f_{out}$ may be retrieved from a memory element (not shown) and used to program the synthesized frequency generation logic and PLL. Alternatively, in the case of an all-analogue VCO, a tuning voltage may be used for programming the tuning control of the reference VCO.

Figure 1:
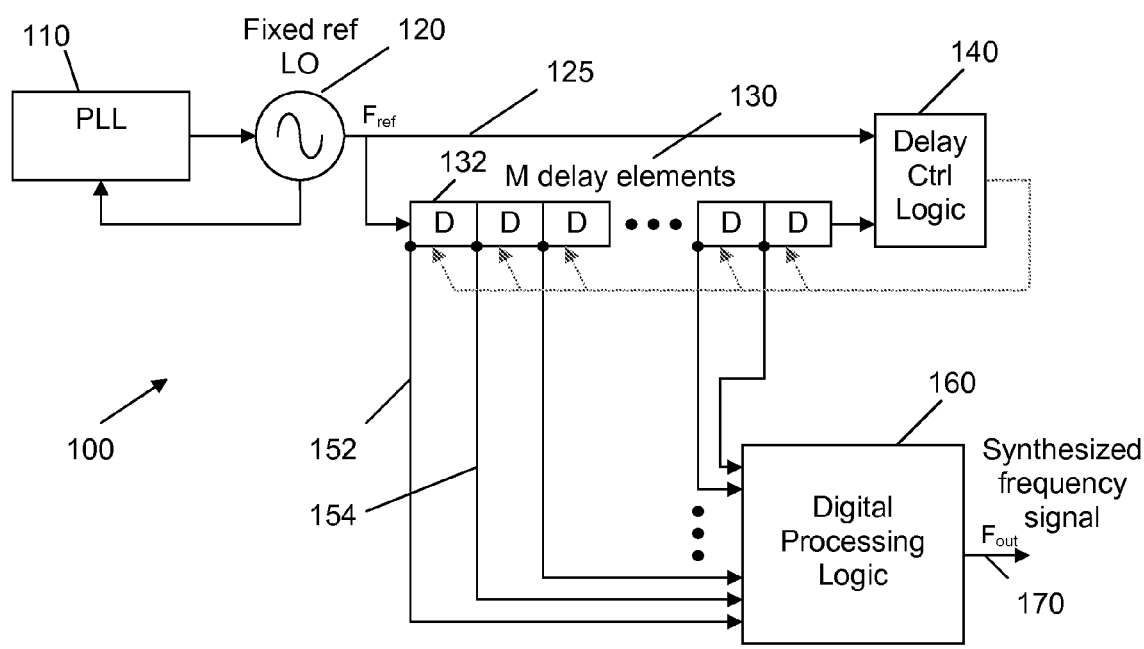
FIG. 1 illustrates a known system Delay Locked Loop Synthesizer.

As will be appreciated, a synthesizer adapted in accordance with embodiments of the invention, when provided with a single reference signal that is tuneable over a range of approximately 4%, and comprising up to ten delay elements, unlike the prior art synthesizer of FIG. 1, is capable of generating all eleven bands required for supporting current UMTS communications. In this manner, the PLL used to generate the reference frequency may comprise a very narrow tuning bandwidth, e.g. 4% as compared to 40% for some conventional structures. This can greatly simplify the cost and effort required to design the PLL. Furthermore, the synthesizer frequency generation logic according to some embodiments of the invention may comprise at least ten delay elements. Furthermore, a semiconductor device, such as the semiconductor device 300 of FIG. 3 may comprise a first synthesized frequency generation logic arranged to receive a first reference signal and to generate a first synthesized frequency signal therefrom for demodulating a received RF signal, and a second synthesized frequency generation logic arranged to receive a second reference signal and to generate a second synthesized frequency signal therefrom for modulating an RF signal for transmission. In this manner, the semiconductor device may comprise a full duplex system capable of supporting all eleven bands within a UMTS network.

Accordingly, whilst the semiconductor device according to the illustrated embodiments comprises a synthesized frequency generation logic of increased complexity compared to that of the prior art, the reduction in the number of analogue components such as VCOs and inductors that would otherwise be necessary in order to support the required range of frequency bands provides a significant improvement in terms of silicon area requirements, and thus provides a significant increase in the number of such semiconductor devices that can be produced from a single wafer, thereby resulting in a significant reduction in the cost of manufacture for such semiconductor devices.

Figure 7:
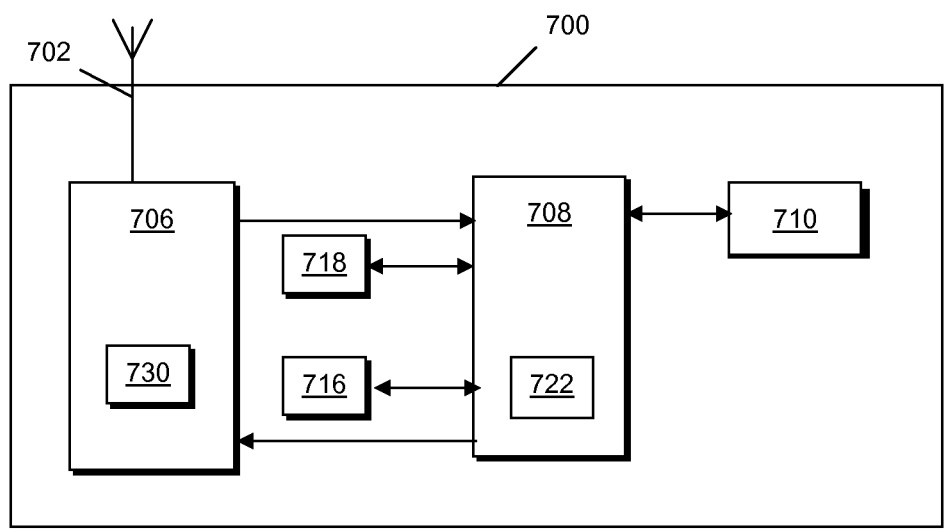
FIG. 7 illustrates a block diagram of part of a wireless communication device adapted in accordance with some embodiments of the invention.

Referring to FIG. 7, there is illustrated a block diagram of part of a wireless communication device 700, adapted to support embodiments of the invention. The wireless communication device 700, in the context of the illustrated embodiment of the invention, is a mobile telephone handset comprising an antenna 702. As such, the communication device 700 contains a variety of well known radio frequency components or circuits 706, operably coupled to the antenna 702. The radio frequency components or circuits 706 of the communication device 700, in accordance with some embodiments of the invention, comprise a semiconductor device 730, for example similar to the semiconductor device 300 of FIG. 3. In particular, the semiconductor device 730 comprises synthesized frequency generation logic arranged to receive a reference signal, and to generate a synthesized frequency signal from the reference signal; the synthesized frequency generation logic comprises programmable divider logic arranged to receive the reference signal and to generate a divided signal comprising a frequency with a period substantially equal to N times that of the reference signal, where N comprises a programmable integer value; and the synthesized frequency generation logic is arranged to generate the synthesized frequency signal comprising a frequency substantially equal to M times that of the divided signal.

For completeness, the wireless communication device 700 further comprises signal processing logic 708. An output from the signal processing logic 708 is provided to a suitable user interface (UI) 710 comprising, for example, a display, keypad, loudspeaker and/or microphone. The signal processing logic 708 is coupled to a memory element 716 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 718 is typically coupled to the signal processing logic 708 to control the timing of operations within the wireless communication device 700.

Figure 8:
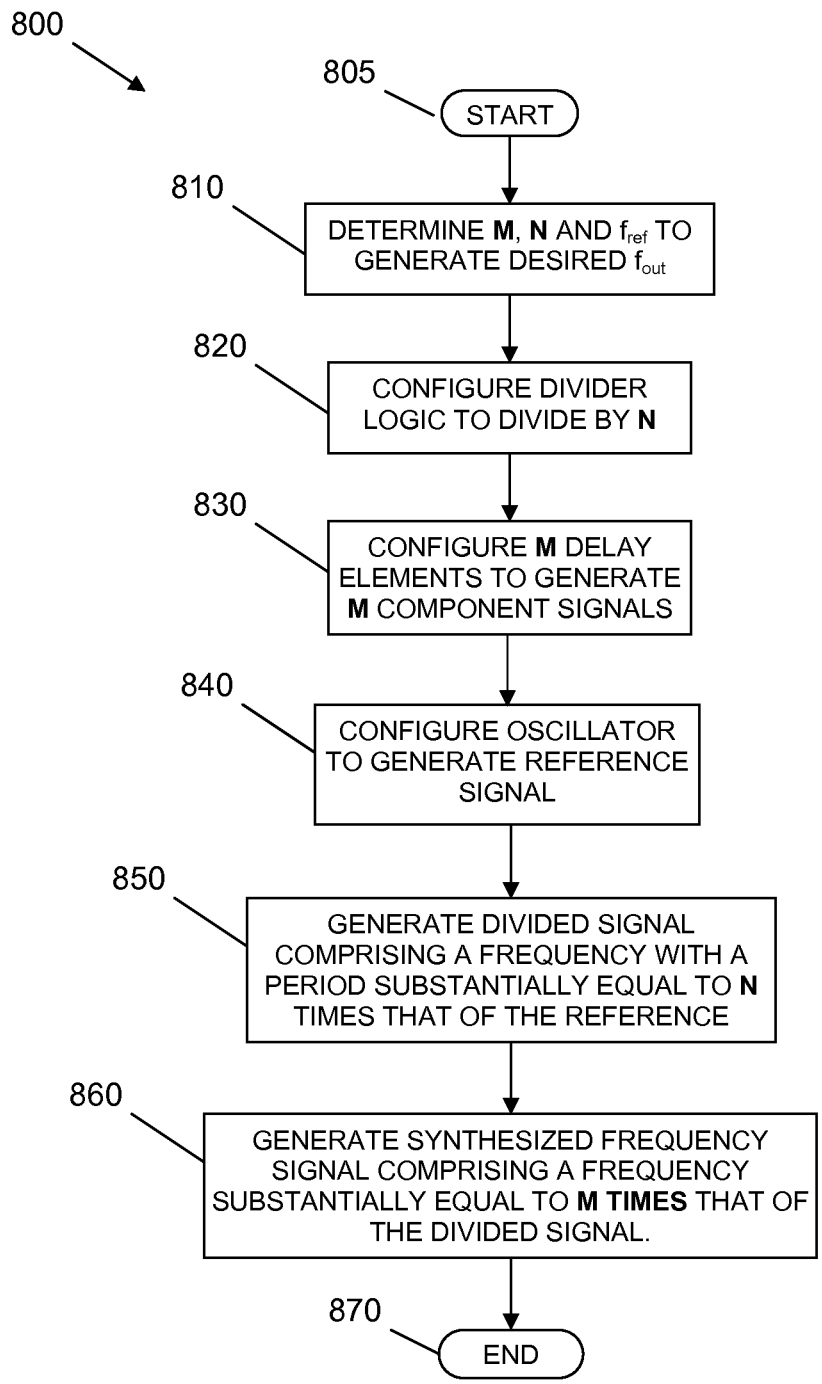
FIG. 8 illustrates a flowchart of a method for generating a synthesized frequency signal in accordance with some embodiments of the invention.
Figure 9:
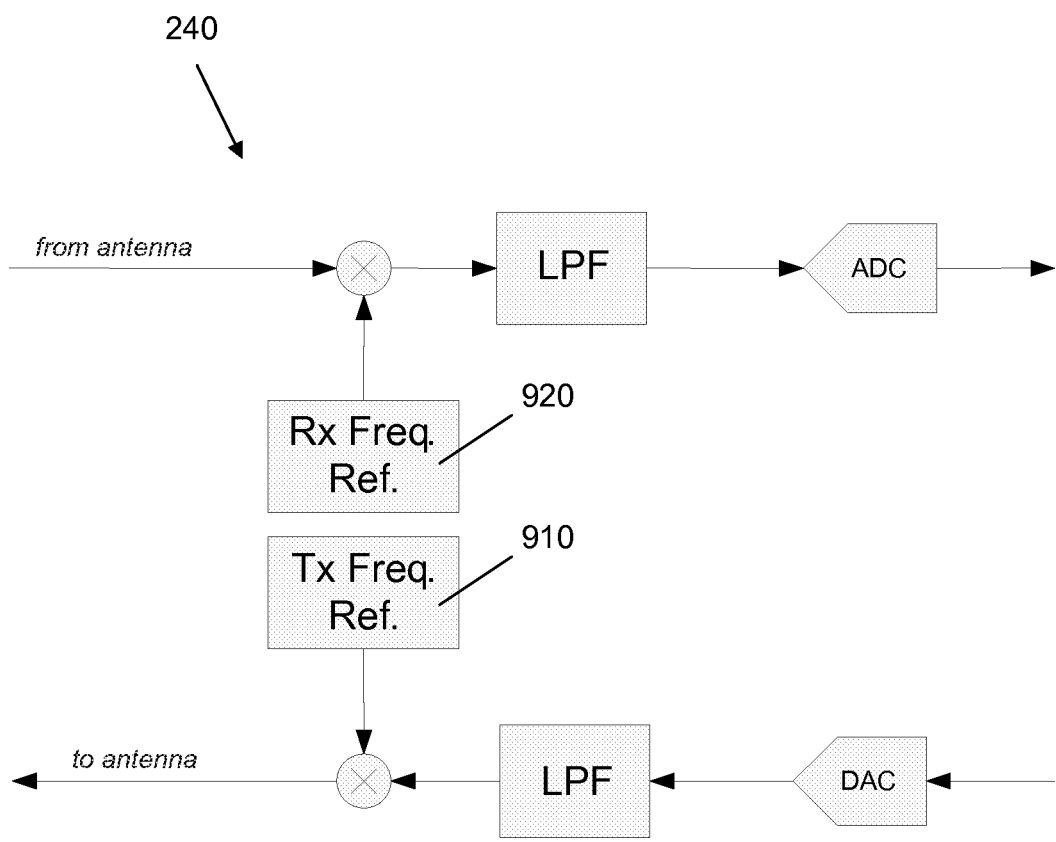
FIG. 9 illustrates an example of a traditional transceiver architecture.

Referring now to FIG. 8, there is illustrated an example of a flowchart 800 of a method for generating a synthesized frequency signal according to some embodiments of the invention. The method starts at step 805, and moves to step 810 where the variables M and N, and in some embodiments of the invention the reference signal ($f_{ref}$), required for generating a desired synthesized frequency signal ($f_{out}$) are determined. For example, a tuning control word, or other variable reference, corresponding to a desired synthesized frequency signal $f_{out}$ may be retrieved from a memory element.

Next, in step 820, divider logic is configured to divide a received reference signal ($f_{ref}$) by N. M delay elements are then configured to generate M component signals, in step 830. For some embodiments of the present invention, the next step, step 840, comprises configuring a local oscillator to generate the required reference signal ($f_{ref}$). Next, in step 850, a divided signal comprises a frequency with a period substantially equal to N times that of the reference signal is then generated, and a synthesized frequency signal comprising a frequency substantially equal to M times that of the divided signal is generated in step 860. The method then ends at step 870.

Figure 10:
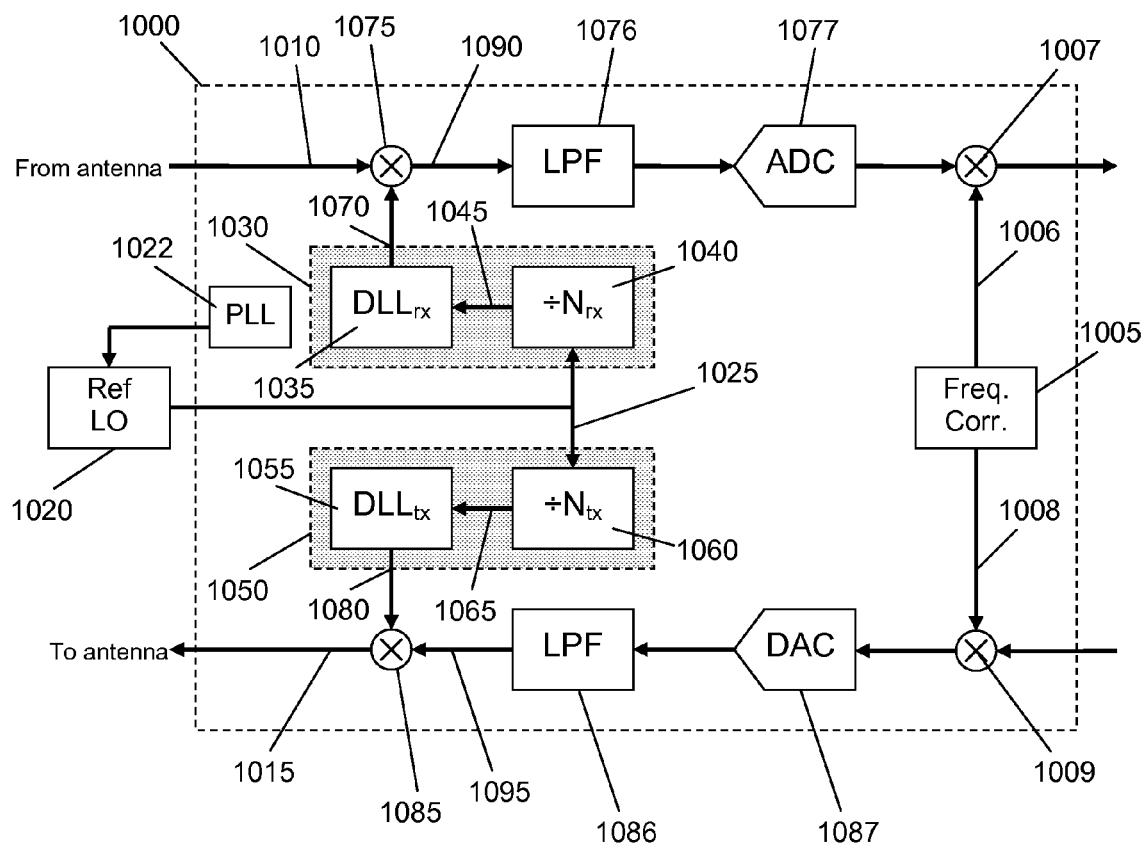
FIG. 10 illustrates an example of a semiconductor device adapted according to some further alternative embodiments of the invention.

Referring now to FIG. 10, there is illustrated an example of a semiconductor device 1000 according to some alternative embodiments of the invention. The semiconductor device 1000 comprises a first synthesized frequency logic 1030 arranged to receive a reference signal 1025, and a second synthesized frequency logic 1050 also arranged to receive the reference signal 1025 and to generate a second synthesized frequency signal 1080 from the common reference signal 1025. In particular, the first synthesized frequency logic 1030 comprises programmable divider logic 1040 arranged to receive the reference signal 1025 and to generate a first divided signal 1045 comprising a frequency with a period substantially equal to $N_{rx}$ times that of the reference signal 1025. The first synthesized frequency generation logic 1030 is further arranged to generate the first synthesized frequency signal 1070 comprising a frequency with a period substantially equal to $1/M_{rx}$ that of the first divided signal 1045. Furthermore, the second synthesized frequency logic 1050 comprises programmable divider logic 1060 arranged to receive the reference signal 1025 and to generate a second divided signal 1065 comprising a frequency with a period substantially equal to $N_{tx}$ times that of the reference signal 1025. The second synthesized frequency generation logic 1050 is further arranged to generate the second synthesized frequency signal 1080 comprising a frequency with a period substantially equal to $1/M_{tx}$ that of the second divided signal 1065. $N_{rx}$, $N_{tx}$, $M_{rx}$ and $M_{tx}$ each comprise a programmable integer value.

In the same manner as for the synthesized frequency generation logic 330 of FIG. 3, each programmable divider logic 1040, 1060 enables its corresponding synthesized frequency generation logic 1030, 1050 to generate synthesized frequency signals that are not limited to necessarily having edges that coincide with edges of the reference signal 1025. Thus, each synthesized frequency generation logic 1030, 1050 is not limited to generating synthesized frequency signals comprising frequencies equal to integer multiples (1/M) of the reference signal 1025. Instead, each synthesized frequency generation logic 1030, 1050 adapted according to embodiments of the invention is able to generate synthesized frequency signals 1070, 1080 comprising frequencies that have periods that are substantially equal to N/M that of the frequency of the reference signal 1025. As previously mentioned, both N and M are programmable integers. Thus, from a single reference signal, two substantially independent synthesized frequency signals may be generated from a single reference signal. In accordance with examples of some embodiments of the present invention, the first synthesized frequency signal 1070 may be provided to mixer circuitry 1075 and used for down converting a received RF signal 1010 to a receive chain intermediate frequency signal 1090, and the second synthesized frequency signal 1080 may be provided to mixer circuitry 1085 and used for up converting a transmit chain intermediate frequency signal 1095 to an RF signal 1015 to be transmitted. Thus, a single reference signal may be used to generate synthesized frequency signals within both the transmit and receive chains of a duplex RF transceiver architecture, reducing the number of VCOs and associated analogue components required.

As will be appreciated by a skilled artisan, the combination of integer values for $N_{rx}$, $N_{tx}$, $M_{rx}$ and $M_{tx}$ that may be applied to generate the synthesized frequency signals 1070, 1080 from the single reference signal frequency 1025 typically may not be able to simultaneously generate precisely the required synthesized frequency signals 1070, 1080. As a result, frequency errors may arise within the resulting down converted receive chain intermediate frequency signal 1090 and/or the up converted RF signal 1015 to be transmitted. Thus, and in accordance with some embodiments of the invention, the semiconductor device 1000 may comprise frequency error correction logic 1005 arranged to introduce a frequency error correction offset into the receive chain intermediate frequency signal 1090 and/or the transmit chain intermediate frequency signal 1095.

In particular for the embodiment illustrated in FIG. 10, the error correction logic 1005 is arranged to generate a first frequency error correction offset signal 1006, which is provided to mixer circuitry 1007 within the receive chain of the semiconductor device 1000 such that the first frequency error correction offset signal 1006 is introduced into the receive chain intermediate frequency signal 1090, substantially correcting any frequency error therein resulting from an error in the respective synthesized frequency signal 1070. Similarly, the error correction logic 1005 is arranged to generate a second frequency error correction offset signal 1008, which is provided to mixer circuitry 1009 within the transmit chain of the semiconductor device 1000 such that the second frequency error correction signal 1008 is introduced into the transmit chain intermediate frequency signal 1095, substantially offsetting the frequency thereof to compensate for any frequency error within the respective synthesized frequency signal 1080.

For the illustrated embodiment, the error correction offsets are applied to the respective receive and transmit chain intermediate frequency signals 1090, 1095 within the digital domain. Accordingly for the illustrated embodiment, the mixer circuitry 1075 is operably coupled to Low Pass Filter (LPF) circuitry 1076, which filters the receive chain intermediate frequency signal 1090. The receive chain intermediate frequency signal 1090 is then converted from analogue to digital by Analogue to Digital Converter (ADC) circuitry 1077. The frequency error correction offset signal 1006 is then introduced by mixer circuitry 1007 within the digital domain. Conversely, the second frequency error correction signal 1008 is introduced into the transmit chain intermediate frequency signal 1095 within the digital domain by mixer circuitry 1009. The transmit chain intermediate frequency signal 1095 is then converted from a digital form to an analogue form by Digital to Analogue Converter (DAC) circuitry 1087, and filtered by LPF filter 1086 before being up converted by mixer circuitry 1085 to the RF signal 1015 to be transmitted.

In accordance with some alternative embodiments, it is anticipated that the error offsets may be introduced in the analogue domain. However, this would require additional analogue hardware. In the digital domain the hardware may already exist (e.g. if the transceiver is already a VLIF system) and its programming may be suitably adjusted. However, even if the hardware is not already present, it is typically more cost effective to include the functionality in the digital domain than in the analogue domain. A potential disadvantage of introducing the error offsets in the digital domain, rather than the analogue domain, is to require greater bandwidth for the ADC and/or DAC, which depending on the converter design may or may not be a potential problem.

Figure 2:
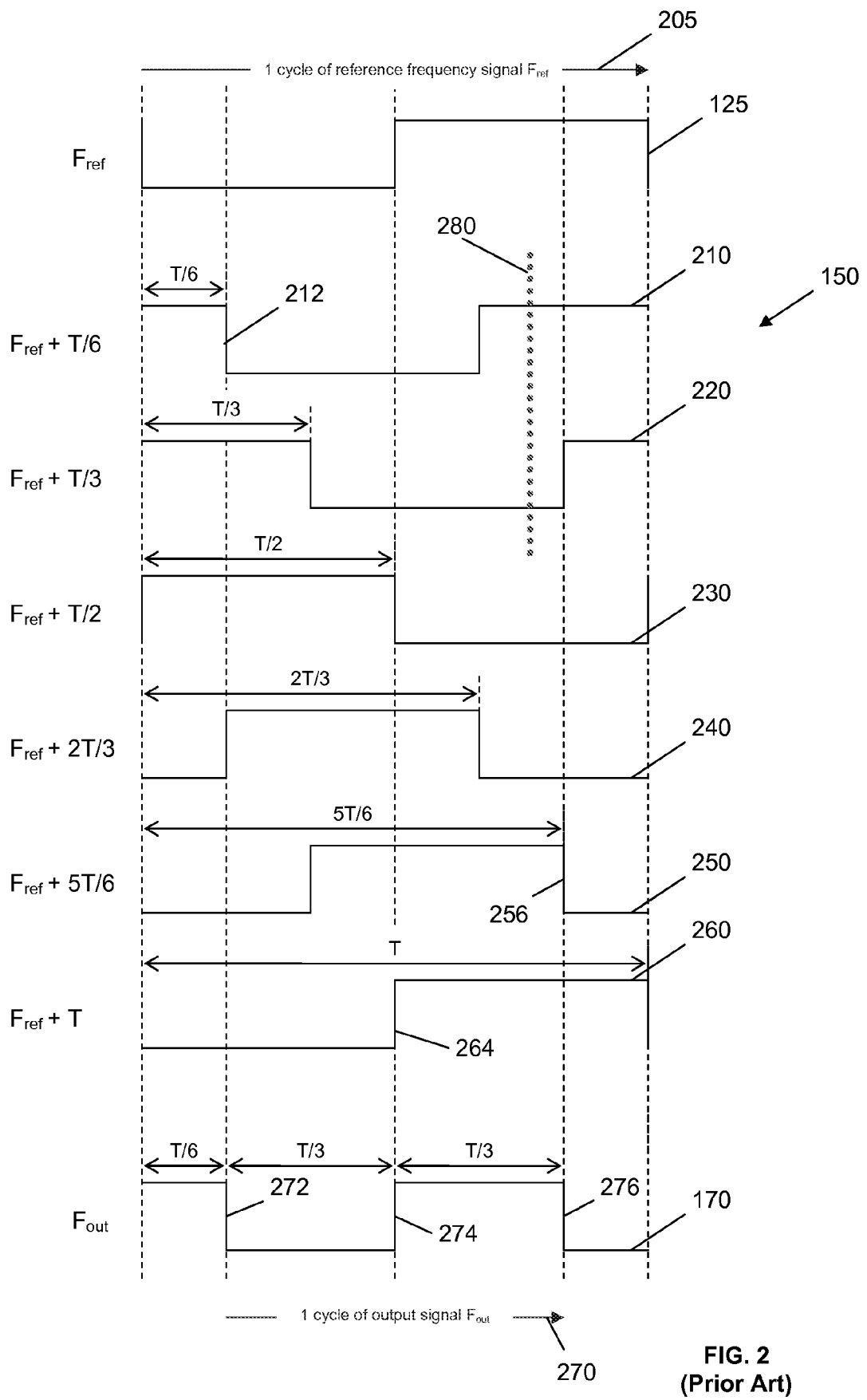
FIG. 2 illustrates a cycle of a synthesized frequency signal of the system Delay Locked Loop Synthesizer of FIG. 1.

For the illustrated embodiment, the reference signal 1025 is generated by a local oscillator 1020, for example in a form of a Voltage Controlled Oscillator (VCO). Furthermore, for the illustrated embodiment, the semiconductor device 1000 further comprises programmable oscillator control logic in a form of Phase Locked Loop (PLL) 1022. PLL 1022 is operably coupled to the local oscillator 1020, and is arranged to programmably control the frequency of the reference signal 1025 generated by the local oscillator 1020. As previously mentioned with reference to FIG. 2, slight variations in the frequency of the reference signal 1025 will have an effect on the synthesized frequency signals 1070, 1080 generated by the synthesized frequency generation logic blocks 1030, 1050. Thus, the programmable oscillator control logic 1022 provides the ability to further vary the range of frequencies that the synthesized frequency generation logic blocks 1030, 1050 are able to generate.

As previously mentioned, for the illustrated embodiment, the oscillator control logic comprises a PLL 1022. The PLL 1022 may be programmable by way of a tuning control, for example in a form of an Absolute Radio Frequency Channel Number (ARFCN) input signal (not shown). For example, the PLL 1022 may be programmed by controlling a divide ratio used by a fractional 'N' divider (not shown) within the PLL 1022, whereby there is a direct relationship between each ARFCN and the necessary divide ratio.

The programmable oscillator control logic 1022 may further comprise an Automated Frequency Control (AFC) input signal, enabling the oscillator control logic 1022 to correct any error in the reference signal generated by the oscillator 1020.

For the illustrated embodiment, each of the synthesized frequency generation logic blocks 1030, 1050 comprises, or is in a form of, a Delay Locked Loop (DLL) 1035, 1055. For example, in the same manner as for the synthesized frequency generation logic 330 of FIG. 3, each DLL 1035, 1055 may comprise delay elements (not shown), operably coupled to the respective divider logic 1040, 1060, and arranged to receive the respective divided signal 1045, 1065 generated by the respective divider logic 1040, 1060, and to generate at least $M_{rx}$ and $M_{tx}$ component signals respectively comprising corresponding edge transitions separated in time by $T_{rx}/M_{rx}$ and $T_{tx}/M_{tx}$ respectively, where $T_{rx}$ and $T_{tx}$ are the periods of the divided signals 1045, 1065 respectively. In this manner, the synthesized DLLs 1035, 1055 may further comprise digital processing logic (not shown) arranged to receive the at least $M_{rx}$ and $M_{tx}$ component signals respectively, and to generate the synthesized frequency signals 1070, 1080 respectively based at least partly on a combination of the component signals provided thereto by selecting which of the component signals to output at any one time.

Figure 11:
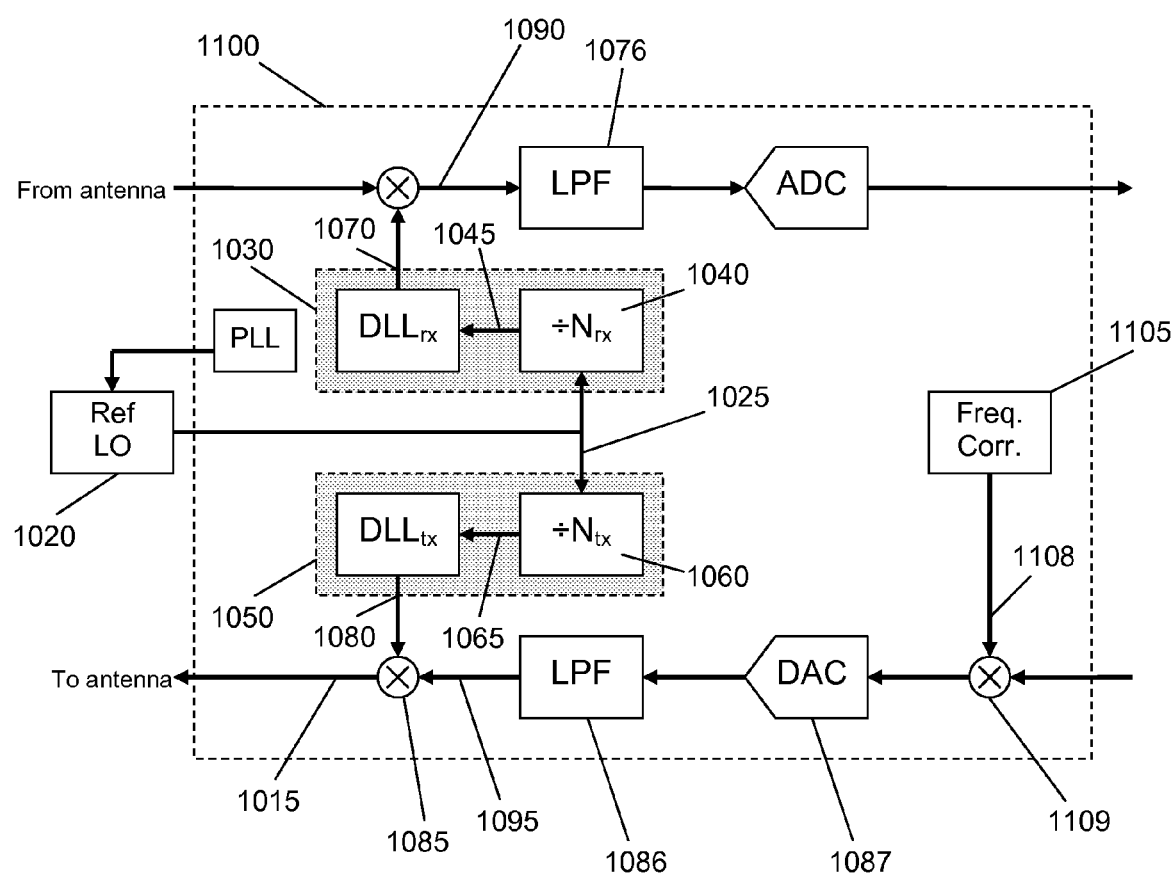
FIG. 11 illustrates an example of a semiconductor device adapted according to some further alternative embodiments of the invention.

Referring now to FIG. 11 there is illustrated an example of a semiconductor device 1100 according to some further alternative embodiments of the invention. In the same manner as for the semiconductor device 1000 of FIG. 10, and therefore similarly numbered, the semiconductor device 1100 of FIG. 11 comprises a first synthesized frequency logic 1030 arranged to receive a reference signal 1025, and a second synthesized frequency logic 1050 also arranged to receive the reference signal 1025 and to generate a second synthesized frequency signal 1080 from the common reference signal 1025. In particular, the first synthesized frequency logic 1030 comprises programmable divider logic 1040 arranged to receive the reference signal 1025 and to generate a first divided signal 1045 comprising a frequency with a period substantially equal to $N_{rx}$ times that of the reference signal 1025. The first synthesized frequency generation logic 1030 is further arranged to generate the first synthesized frequency signal 1070 comprising a frequency with a period substantially equal to $1/M_{rx}$ that of the first divided signal 1045. Furthermore, the second synthesized frequency logic 1050 comprises programmable divider logic 1060 arranged to receive the reference signal 1025 and to generate a second divided signal 1065 comprising a frequency with a period substantially equal to $N_{tx}$ times that of the reference signal 1025. The second synthesized frequency generation logic 1050 is further arranged to generate the second synthesized frequency signal 1080 comprising a frequency with a period substantially equal to $1/M_{tx}$ that of the second divided signal 1065. $N_{rx}$, $N_{tx}$, $M_{rx}$ and $M_{tx}$ each comprise a programmable integer value.

As will be appreciated, blocker rejection will typically constrain the bandwidth of the LPF 1076 within the receive chain. Thus, and in accordance with the embodiment illustrated in FIG. 11, the reference signal 1025, and integer values $N_{rx}$, and $M_{rx}$ are configured to generate a zero error within the synthesized frequency signal 1070 for the receive path, whilst $N_{tx}$, and $M_{tx}$ may be configured to generate an error within the synthesized frequency signal 1080 for the transmit path that is constrained to an acceptable bandwidth for the LPF 1086 within the transmit chain. Thus, for the embodiment illustrated in FIG. 11, the semiconductor device comprises error correction logic 1105 arranged to introduce a frequency error correction offset 1108 into transmit chain intermediate frequency signal 1095. In particular the frequency error correction offset 1108 is introduced into the transmit chain intermediate frequency signal 1095 within the digital domain by mixer circuitry 1109. The transmit chain intermediate frequency signal 1095 is then converted from digital to analogue by DAC circuitry 1087, and filtered by LPF filter 1086 before being up converted by mixer circuitry 1085 to the RF signal 1015 to be transmitted.

Figure 12:
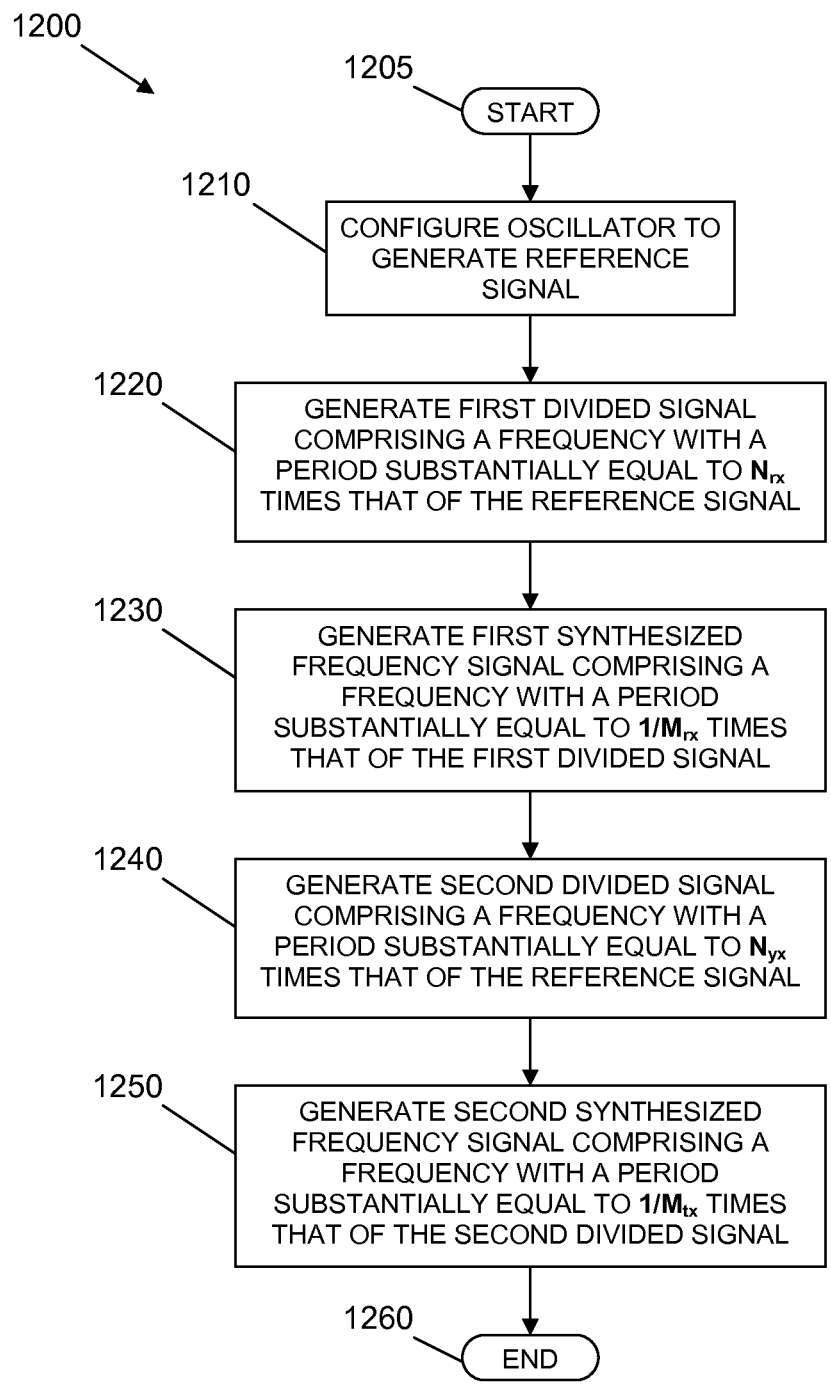
FIG. 12 illustrates an example of a simplified flowchart for a method for generating a first synthesized frequency signal and a second synthesized frequency signal in accordance with some embodiments of the invention.

Referring now to FIG. 12, there is illustrated an example of a simplified flowchart 1200 for a method for generating a first synthesized frequency signal and a second synthesized frequency signal. For example, the method may be implemented for generating synthesized frequency signal for use in the transmit and receive chains of an RF transceiver.

The method starts at step 1205, and moves on to step 1210 with the configuration of an oscillator to generate a reference signal 1210. Next, in step 1220, a first divided signal comprising a frequency having a period substantially equal to $N_{rx}$ times that of the reference signal. The first synthesized frequency signal is then generated comprising a frequency with a period substantially equal to $1/M_{rx}$ that of the first divided signal in step 1230. Next, in step 1240, a second divided signal comprising a frequency having a period substantially equal to $N_{tx}$ times that of the reference signal. The second synthesized frequency signal is then generated comprising a frequency with a period substantially equal to $1/M_{tx}$ that of the second divided signal in step 1250. The method then ends at step 1260.

In the foregoing specification, the invention has been described with reference to specific examples of embodiments of the invention. It will, however, be evident that various modifications and changes may be made therein without departing from the broader spirit and scope of the invention as set forth in the appended claims.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device comprising first synthesized frequency generation logic arranged to receive a reference signal, and to generate a first synthesized frequency signal from the reference signal;
    wherein the first synthesized frequency generation logic comprises first programmable divider logic arranged to receive the reference signal and to generate a first divided signal comprising a frequency with a period equal to N times that of the reference signal, where N comprises a first programmable integer value; and
    the first synthesized frequency generation logic is further arranged to generate the first synthesized frequency signal comprising a frequency with a period equal to 1/M that of the first divided signal, where M comprises a further programmable integer value.

2. The semiconductor device of claim 1 wherein the semiconductor device further comprises programmable oscillator control logic, operably coupled to an oscillator arranged to generate the reference signal, the programmable oscillator control logic being arranged to programmably control a frequency of the reference signal generated by the oscillator.

3. The semiconductor device of claim 2 wherein the programmable oscillator control logic comprises a Phased-Locked Loop (PLL), programmable by way of a tuning control.

4. The semiconductor device of claim 3 wherein the programmable oscillator control logic comprises a fractional 'N' divider and the programmable oscillator control logic is programmable by controlling a divide ratio used by the fractional 'N' divider.

5. The semiconductor device of claim 2 wherein the programmable oscillator control logic is programmable by way of an Absolute Radio Frequency Channel Number (ARFCN) input signal.

6. The semiconductor device of claim 2 wherein the programmable oscillator control logic is arranged to programmably control a frequency of the reference signal generated by the oscillator over approximately a 4% range thereof.

7. The semiconductor device of claim 1 wherein the first synthesizer frequency generation logic comprises a Delay-Locked Loop (DLL).

8. The semiconductor device of claim 1 wherein the first synthesizer frequency generation logic comprises:
   delay elements, the delay elements arranged to receive the first divided signal generated by the programmable divider logic; and
   logic to generate at least M component signals comprising corresponding edge transitions separated in time by T/M, where T is a period of the divided signal ($f_{div}$).

9. The semiconductor device of claim 8 wherein the first synthesizer frequency generation logic further comprises digital processing logic arranged to receive the at least M component signals, and logic to generate the synthesized frequency signal based at least partly on a combination of the component signals provided thereto by selecting those component signals to output.

10. The semiconductor device of claim 1 wherein the semiconductor device comprises radio frequency, RF, transceiver circuitry arranged to support RF communication within a Universal Mobile Telecommunications System, UMTS.

11. The semiconductor device of any claim 1 wherein the synthesized frequency generation logic module generates a first synthesized frequency signal from the reference signal, and a second synthesized frequency logic is arranged to receive the reference signal and to generate a second synthesized frequency signal from the reference signal; and the programmable divider logic generates a first divided signal comprising a frequency with a period equal to $N_{rx}$ times that of the reference signal, and the synthesized frequency signal comprises a frequency with a period equal to $1/M_{rx}$ that of the divided signal; and
   the second synthesized frequency logic comprises second programmable divider logic arranged to receive the reference signal and to generate a second divided signal comprising a frequency with a period equal to $N_{tx}$ times that of the reference signal, such that the second synthesized frequency generation logic is further arranged to generate the second synthesized frequency signal comprising a frequency with a period equal to $1/M_{tx}$ that of the second divided signal;
   where $N_{rx}$, $N_{tx}$, $M_{rx}$ and $M_{tx}$ each comprise a programmable integer value.

12. The semiconductor device of claim 11 wherein the first synthesized frequency signal is used for down converting a received Radio Frequency, RF, signal to a receive chain intermediate frequency signal, and the second synthesized frequency signal is used for up converting a transmit chain intermediate frequency signal to an RF signal to be transmitted.

13. The semiconductor device of claim 12 wherein the semiconductor device further comprises frequency error correction logic arranged to introduce a frequency error correction offset into at least one from a group of:
   the receive chain intermediate frequency signal; and
   the transmit chain intermediate frequency signal.

14. The semiconductor device of claim 13 wherein frequency error correction is performed within a digital domain.

15. A method for generating a synthesized frequency signal, the method comprising:
   configuring an oscillator to generate a reference signal;
   generating a first divided signal comprising a frequency with a period equal to N times that of the reference signal; and
   generating a first synthesized frequency signal comprising a frequency having a period equal to 1/M that of the first divided signal, where M comprises a further programmable integer value.

16. The method of claim 15 wherein:
   the first divided signal comprises a frequency having a period equal to $N_{rx}$ times that of the reference signal and the first synthesized frequency signal comprises a frequency with a period equal to $1/M_{rx}$ that of the first divided signal; wherein
   the method further comprises:
      generating a second divided signal comprising a frequency with a period equal to $N_{tx}$ times that of the reference signal, and
      generating a second synthesized frequency signal comprising a frequency with a period equal to $1/M_{tx}$ that of the second divided signal;
   where $N_{rx}$, $N_{tx}$, $M_{rx}$ and $M_{tx}$ each comprise a programmable integer value.

17. A semiconductor device comprising:
   a phase locked loop (PLL) arranged to programmably control a VCO to provide a reference signal;
   a first frequency generator comprising a first programmable divider arranged to receive the reference signal and to generate a first divided signal with a period equal to $N_{rx}$ times that of the reference signal, wherein the first frequency generator is arranged to generate a first frequency signal with a period equal to $1/M_{rx}$ that of the first divided signal; and
   a second frequency generator comprising a second programmable divider arranged to receive the reference signal and to generate a second divided signal with a period equal to $N_{tx}$ times that of the reference signal, wherein the second frequency generator is arranged to generate a second frequency signal with a period equal to $1/M_{tx}$ that of the second divided signal;
   wherein $N_{rx}$, $M_{rx}$, $N_{tx}$, and $M_{tx}$ each comprise a programmable integer value.

18. The semiconductor device of claim 17, wherein the PLL is further arranged to control a frequency of the reference signal generated by the VCO.

19. The wireless communication device of claim 17, wherein the first frequency generator further comprises:
   delay elements arranged to receive the first divided signal; and
   logic to generate at least $M_{rx}$ component signals comprising corresponding edge transitions separated in time by $T/M_{rx}$, where T is a period of the divided signal.

20. The semiconductor device of claim 19, wherein the first frequency generator further comprises:
   digital processing logic arranged to receive the at least $M_{rx}$ component signals; and
   a signal combiner arranged to generate the first frequency signal based on a combination of the component signals by selecting the combination of component signals to output.

* * * * *

UNITED STATES PATENT AND TRADEMARK OFFICE
CERTIFICATE OF CORRECTION

| | | |
|---|---|---|
| PATENT NO. | : 8,532,583 B2 | Page 1 of 1 |
| APPLICATION NO. | : 13/003951 | |
| DATED | : September 10, 2013 | |
| INVENTOR(S) | : Norman Beamish et al. | |

It is certified that error appears in the above-identified patent and that said Letters Patent is hereby corrected as shown below:

In the Claims

At column 16, line 17 change "the reference signal and" to be --the reference signal; and--

Signed and Sealed this
Thirtieth Day of June, 2015

Michelle K. Lee
*Director of the United States Patent and Trademark Office*